United States Patent [19]

Shibata

[11] Patent Number: 5,661,407

[45] Date of Patent: Aug. 26, 1997

[54] INTEGRATED CIRCUIT PROBE TESTING DEVICE AND METHOD

[75] Inventor: Yukio Shibata, Haga-gun, Japan

[73] Assignee: Kawasaki Steel Corporation, Hyogo, Japan

[21] Appl. No.: 531,752

[22] Filed: Sep. 21, 1995

[30] Foreign Application Priority Data

Sep. 22, 1994 [JP] Japan .................................. 6-228100

[51] Int. Cl.$^6$ .................................................. G01R 31/28
[52] U.S. Cl. ........................ 324/763; 371/22.31; 364/483
[58] Field of Search ........................................ 324/763, 754, 324/760; 371/22.3, 22.4, 22.5; 364/483

[56] References Cited

U.S. PATENT DOCUMENTS 5,424,589  6/1995  Dobbelaere et al. ...................... 326/41

FOREIGN PATENT DOCUMENTS 2-229488  9/1990  Japan .
2-229448  9/1990  Japan .
4-333252  11/1992  Japan .

*Primary Examiner*—Kenneth A. Wieder
*Assistant Examiner*—Barry C. Bowser
*Attorney, Agent, or Firm*—Oliff & Berridge

[57] ABSTRACT

The invention provides efficient probe testing of integrated circuits. Bonding pads of the integrated circuits are provided with logic state components and data recording components. Logic circuits of the above components are serially connected to form shift registers. The shift registers permit input and output of data by an integrated circuit test device through a small number of test pads. The number of test pads remain the same for different types of integrated circuits. A single set of test pads may be used to probe test all the integrated circuits of a single semiconductor wafer.

19 Claims, 10 Drawing Sheets

|  | P 1 | P 2 | P 3 | P 4 |
|---|---|---|---|---|
| T 1 | 1 | X | 1 | 0 |
| T 2 | X | H | X | X |
| T 3 | 0 | X | X | 1 |
| T 4 | X | H | X | X |

FIG. 8

INTEGRATED CIRCUIT PROBE TESTING DEVICE AND METHOD

BACKGROUND OF THE INVENTION

1. Field of the Invention

The invention is related to probe testing of integrated circuits.

2. Description of Related Art

Integrated circuits offer a large number of benefits, including miniaturization of electronic devices, improved reliability, and reduced power consumption. In recent years, the density of integrated circuits has increased greatly and the number of pins of the integrated circuit packages has also increased.

The decreasing price of integrated circuits has lead to testing integrated circuits during earlier stages of the manufacturing process. By rapidly eliminating inferior products, during the manufacturing process, manufacturing costs are reduced.

Probe testing is performed prior to dicing a semiconductor wafer into individual integrated circuit chips. Probe testing requires multiple probe pins to be attached to a probe card. The probe pins contact bonding pads which are connected to internal circuits of an integrated circuit. The operation of the integrated circuit is tested through the probe pins.

The probe card is positioned for each integrated circuit (test subject) on the semiconductor wafer and the probe pins are connected to the bonding pads of the test subject. An integrated circuit test device is electrically connected to the test subject through the bonding pads testing both the electrical characteristics and operational functions of the integrated circuit. Only those integrated circuits that pass the probe testing process are packaged into final products.

The number of pins of the integrated circuits is increasing because generally the number of pins increase as technology is able to increase the number of functions performed by each integrated circuit. When the number of pins increase, the number of bonding pads of the integrated circuit increases. Since the physical dimensions of the integrated circuit chips are limited to certain values, an increase in the number of bonding pads decreases the size of the bonding pads and reduces the spaces between the bonding pads.

As the number of bonding pads increases and the size and spacing of the bonding pads decrease, the number of probe pins increases. The probe pins and the positioning gaps between the probe pins become narrower. There is a limit to the number of probe pins that can be attached to a probe card and probe cards having a large number of probe pins are costly. When the number of probe pins attached to a probe card increases, positioning the probe pins onto the bonding pads requires an ever increasing level of precision. Thus, a high level of technology is required to connect the probe card to the test subject. The technology required for integrated circuit test device that includes the probe card is also increased. Thus, the cost of the integrated circuit test device is increased.

The probe card requires personalization for each type of integrated circuit chip to be tested. A cost is associated with the personalization process which includes the labor involved. Thus, an increase in the number of probe pins attached to the probe card increases the cost of the probe card and the cost of the labor associated with personalizing and maintaining the probe card.

Japanese Patent 2-229448 (unexamined) discloses connecting input signal pad(s) with flip-flop circuit groups and between input signal pads which reduce the number of test input terminals. Japanese Patent 4-333252 discloses a technology to reduce the number of utilized pads. However, neither disclosure resolve the problems discussed above.

SUMMARY OF THE INVENTION

It is an objective of the invention to provide a probe testing device and method that have exceptional performance even for a large number of integrated circuit pins and a large number of bonding pads. The performance remains excellent even when the bonding pads are small and the positioning gaps between the bonding pads are narrow.

The probe testing device includes logic circuits in the integrated circuit substrate which are connected to the bonding pads. The logic circuits input from and output to an external component of the probe testing device. The logic circuits comprise a plurality of bonding pad logic state components. Each of the bonding pad logic state components is associated with one bonding pad. Each of the bonding pad logic state components comprises a tristate buffer gate, data recorder and tristate control recorder. Each bonding pad has three logic states: a high impedance state, an H state, and an L state. The bonding pad logic states are generated by the tristate buffer gate of each of the bonding pad logic state components. The state of each bonding pad is determined by the corresponding tristate control recorder and the tristate data recorder. The tristate data recorder records the data to be input to the tristate buffer gate and the tristate control recorder records whether the tristate output is the high impedance state or the logic state of the tristate buffer gate input. In addition, the tristate data and control recorders are serially connected to form a shift register which serially shifts the data and control input/output from the external component to the integrated circuit.

Test pads are provided to serially shift signals to/from the internal logic circuits of the integrated circuit from/to the external component through the shift register. The probe pins contact the test pads and provide input signals to the integrated circuit from the external component. The input signals from the probe pins are driven by probe tests.

The probe testing device further includes data recording components. Each of the data recording components comprises a data recorder and a corresponding multiplexer. The data recorder records data from a bonding pad. The corresponding multiplexer is controlled by the external component and has 2 inputs. One input is connected to the bonding pad and the other input is connected to the data recorder. The 2 inputs are interchangeable.

The data recording components are connected together to form a shift register. The data recorded from the bonding pads are readout to the external component by serially shifting the shift register.

In addition, since the data recording and bonding pad logic state components record data from and set data to the bonding pads directly and since both the data recording and bonding pad logic state components are controlled by the external component through test pads, the probe testing device functions even under operational conditions of the test subject.

The test pads, the bonding pad logic state components, and the data recording components may be formed in scribe line areas of the semiconductor wafer. These areas are outside the integrated circuit area. Thus, no additional semiconductor wafer surface area is required. Accordingly, improvements in miniaturization of the integrated circuit is not impeded because the size of the integrated circuit after dicing remains small and circuit density is not compromised.

Further, at least one of the test pads are formed at an outer circumference of the semiconductor wafer. These test pads are commonly used for all of the integrated circuits on a semiconductor wafer. The common test pads permit a single accurate positioning of the probe card for testing all the integrated circuits on the semiconductor wafer. Thus, the performance of the test operation is improved and the required test time is reduced.

Another objective of the invention is to provide a probe testing method by providing a plurality of bonding pads formed on the semiconductor wafer. A bonding pad logic state is set for each of the plurality of bonding pads through logic circuits coupled to the plurality of bonding pads and a plurality of test pads. The logic state of each of the plurality of bonding pads is determined by an external device. The external device controls the logic circuits independent of the operation of the integrated circuits. The external circuit inputs and outputs control signals and data to the plurality of bonding pads through the logic circuits.

BRIEF DESCRIPTION OF THE DRAWINGS

The invention is described with reference to the following drawings wherein:

FIG. 8 shows theoretical values for an operational example of an internal logic circuit;

DESCRIPTION OF PREFERRED EMBODIMENT

In comparison with wire bonding wires, it is extremely difficult to narrow the pitch of probe pins used in probe tests. Aluminum or gold wires used in wire bonding are reliable if their pulling strength is strong and if the connected state is maintained. In contrast, probe pins must have a specified rigidity. The probe pin thickness cannot be reduced beyond certain limits. Even if the probe pins are attached to the probe card in multiple numbers, there are limits to the narrowness of the probe pin pitch. Therefore, the invention provides an advantage by enlarging the test pads of the integrated circuit that attach to the probe pins.

The invention provides test pads that are attached to the outer circumference of an integrated circuit of a semiconductor wafer, to a scribe line exterior to the integrated circuit, or to an external circumference of the semiconductor wafer. Signals from the test pads are serially shifted to the bonding pads of the integrated circuit.

Figure 1:
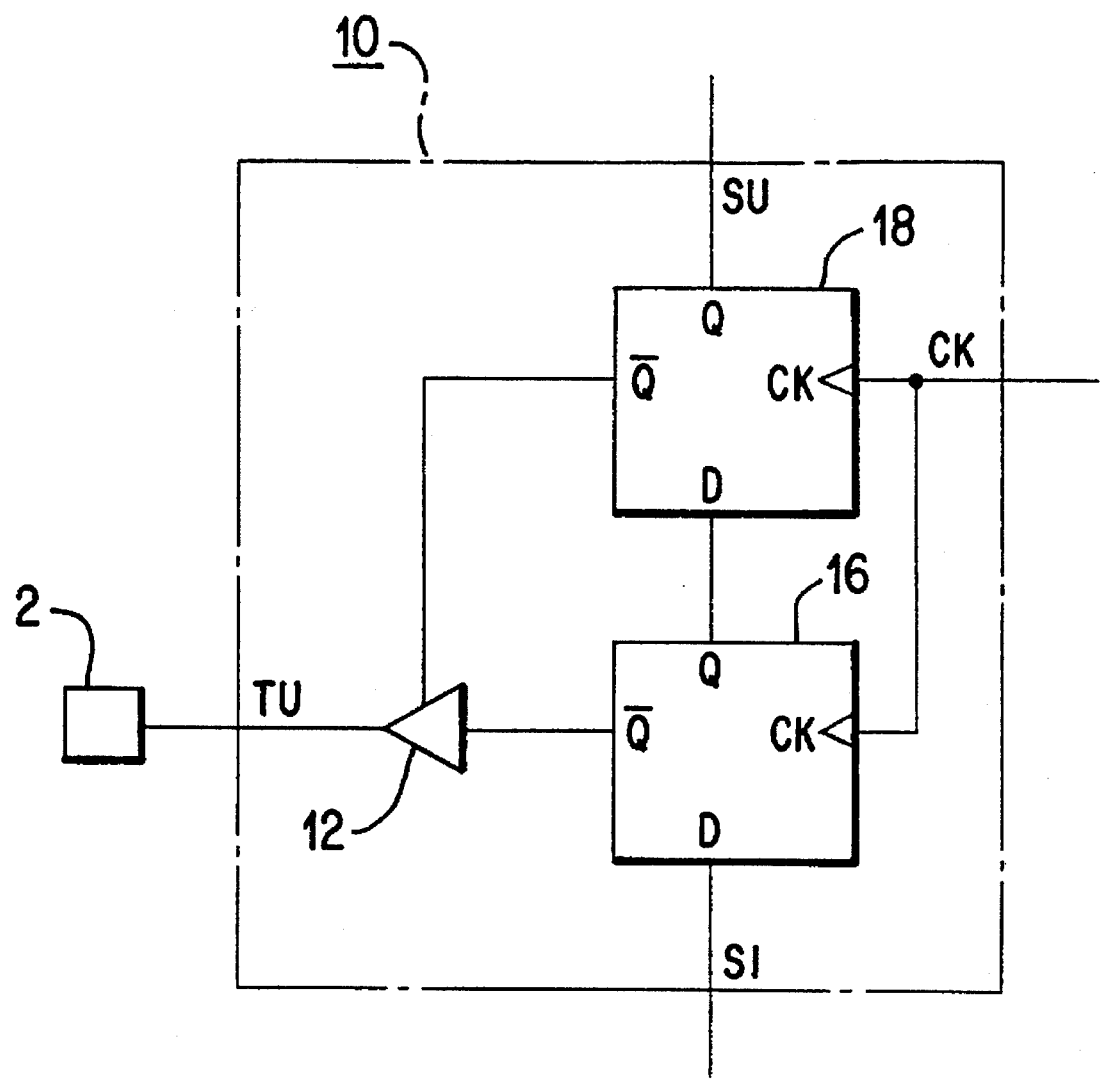
FIG. 1 is a logic circuit diagram of a bonding pad logic state component.

In FIG. 1, the bonding pad logic state component 10 has a tristate output buffer gate 12, a tristate data recorder 16, and a tristate control recorder 18 which sets the tristate output buffer gate 12 to either a pass through state or a high impedance state.

When the tristate output buffer gate 12 is in the pass through state, the output of the tristate buffer gate 12, and, thus, the data of the bonding pad 2, has the same logic value as the output of the tristate data recorder 16. When the tristate buffer gate 12 is in the high impedance state, the output of the tristate buffer gate 12 does not affect the logic state of the bonding pad 2. Thus, when the tristate buffer 12 is in the high impedance state, the bonding pad 2 may be used to input data.

The tristate control recorder 18 and the tristate data recorder 16 are serially connected to form a shift register. Serial data is shifted into the SI input of each of the bonding pad logic state component 10 into the tristate data recorder 16 and the tristate control recorder 18. The bonding pad logic state components 10 corresponding to all the bonding pads are serially connected to form a logic state shift register. The serial input to this shift register is connected to the external component. Thus, the external component controls the states of all the tristate buffer gates 12 and the data output from the tristate buffer gates 12 by shifting data into the logic state shift register. Alternately, the logic state shift register may be formed by either the tristate control recorder 18 or the tristate data recorder 16.

Test pads are provided for input into the logic state shift register from the external component. One of the test pads is connected to the input of the logic state shift register and another test pad is connected to the clock signal CK of the tristate data and control recorders. As shown in FIG. 1, the clock signal CK is connected to the clock inputs of the tristate data recorder 16 and the tristate control recorder 18. Thus, the shifting of the logic state shift register is controlled by the clock signal CK.

Since the number of test pads is independent of the number of bonding pads 2, the number of test pads required for an integrated circuit does not increase with an increasing number of bonding pads 2. Accordingly, only a small number of test pads is required allowing the test pads to be broadened.

The broadening of the test pads permits a corresponding expansion of the positional gap of the probe pins. This expansion reduces the number of probe pins attached to the probe cards, thus reducing the cost of the probe cards. However, the cost savings from the improved probe cards should be applied to strengthen the construction of the probe cards and probe pins to improve reliability.

Further, since the number of test pads is independent of the number of bonding pads 2 of the integrated circuit, the number of test pads and the test pad pattern may be the same across many different types of integrated circuits. Thus, a standard test pad pattern can be established.

The standard test pad pattern contributes to further reduction of costs because a standard probe card and probe pins may be used for many integrated circuits. In addition, because the number of test pads are reduced, the positional gap between the probe pins are expanded and accurate positioning of the probe card to contact the probe pins to the test pads can be easily achieved. Further, the cost of the integrated circuit test device can also be reduced.

The bonding pad logic state component 10 and/or the test pads may be formed outside the circumference of the integrated circuit. The bonding pad logic state component 10 and/or the test pad may be formed over the semiconductor wafer area devoted to the scribe lines required for dicing. Thus, the bonding pad logic state component 10 and/or the test pad require no additional semiconductor wafer area allowing further miniaturization of the integrated circuit.

Figure 2:
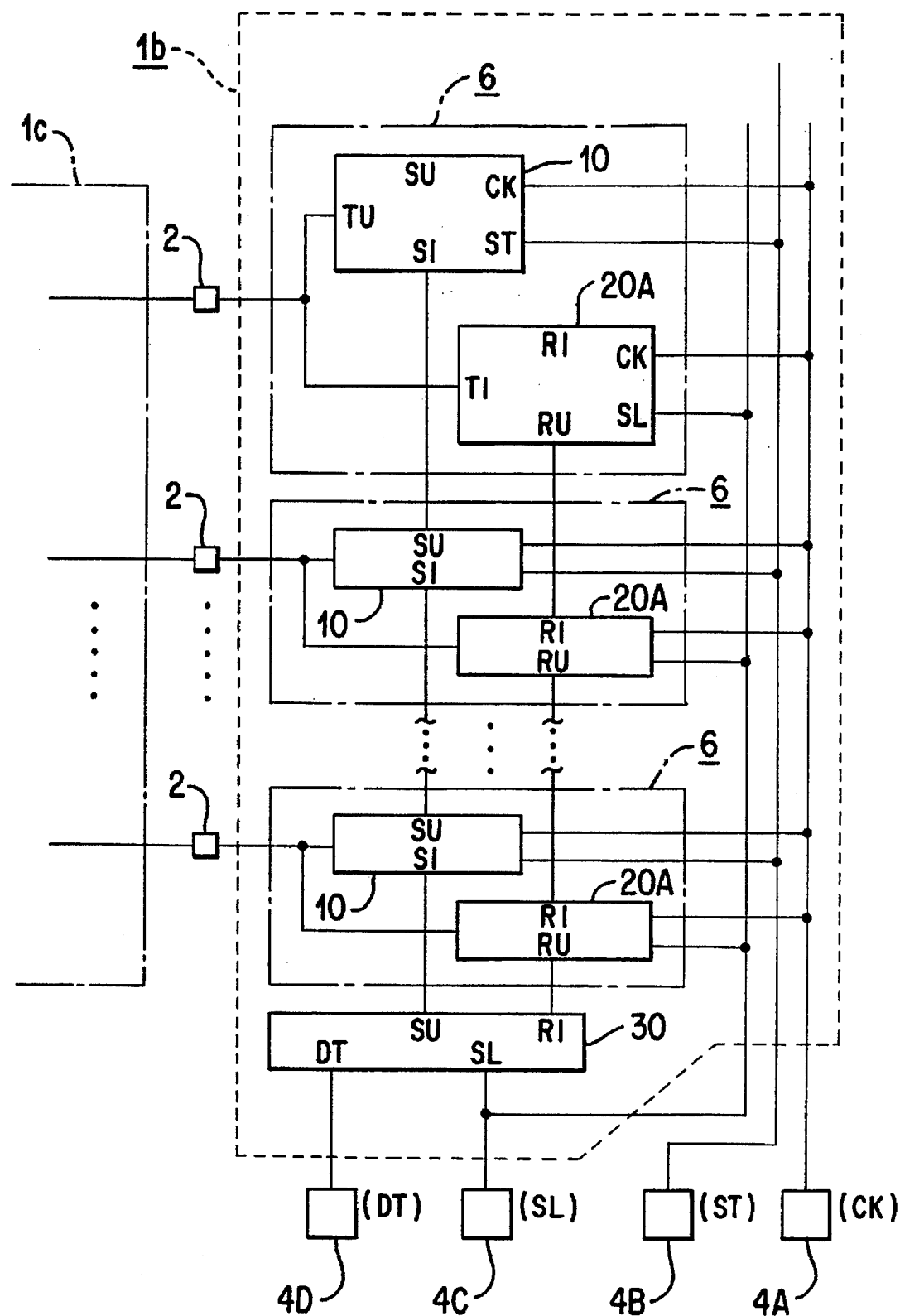
FIG. 2 is a circuit diagram of a test circuit.

In FIG. 2, a test circuit 1b is connected to the integrated circuit 1c through the bonding pads 2. The bonding pads 2 are external to the outside circumference of the integrated circuit 1c. A pad test circuit 6 of the test circuit 1b is connected to the bonding pads 2. The pad test circuit 6 includes bonding pad logic state components 10 and data recording components 20A.

Figure 5:
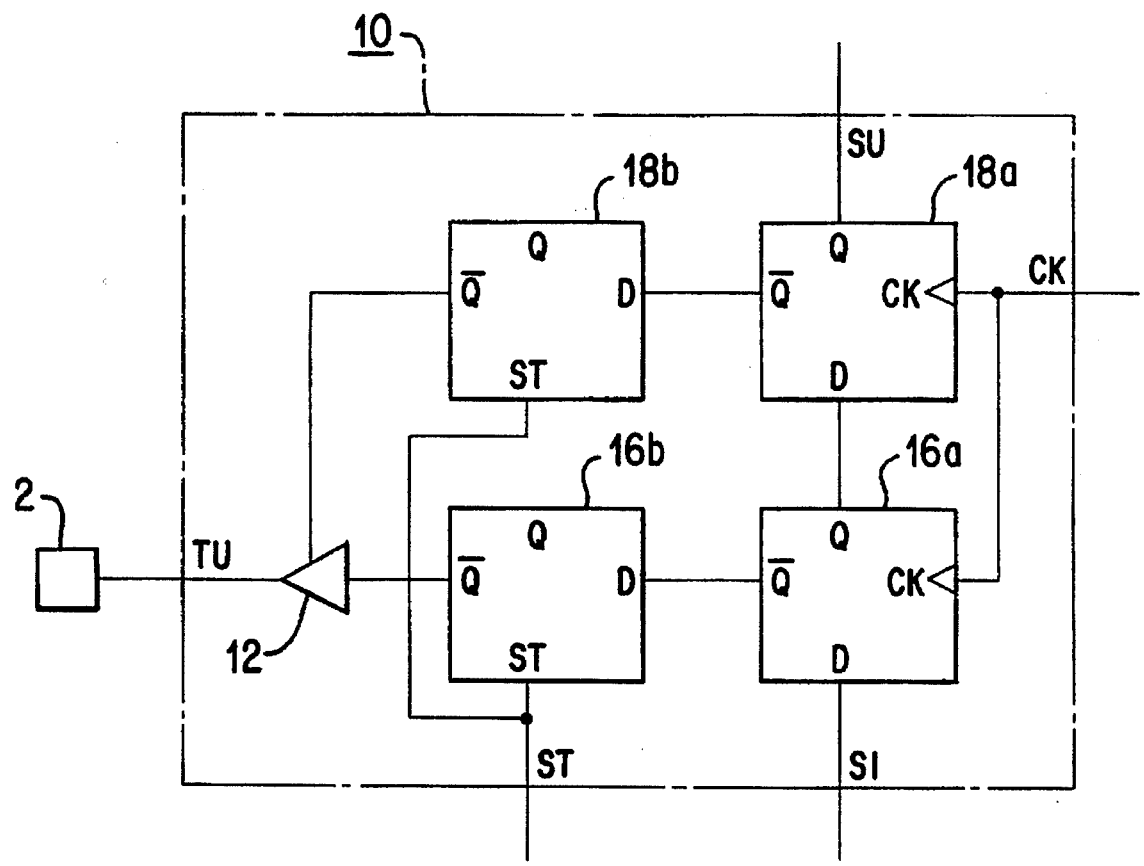
FIG. 5 is a logic circuit diagram of the bonding pad logic state component.

One of the bonding pad logic state components 10 is shown in greater detail in FIG. 5. D flip-flops 16a and 16b form the tristate data recorder and D-flip-flops 18a and 18b form the tristate control recorder. A D-flip-flop 16a is serially connected with the D-flip-flop 18a having input SI and output SU. As shown in FIG. 2, the bonding pad logic state components 10 are serially connected by connecting the SI inputs of each bonding pad logic state component 10 with the output of a previous bonding pad logic state component 10 forming the logic state shift register.

Figure 6:
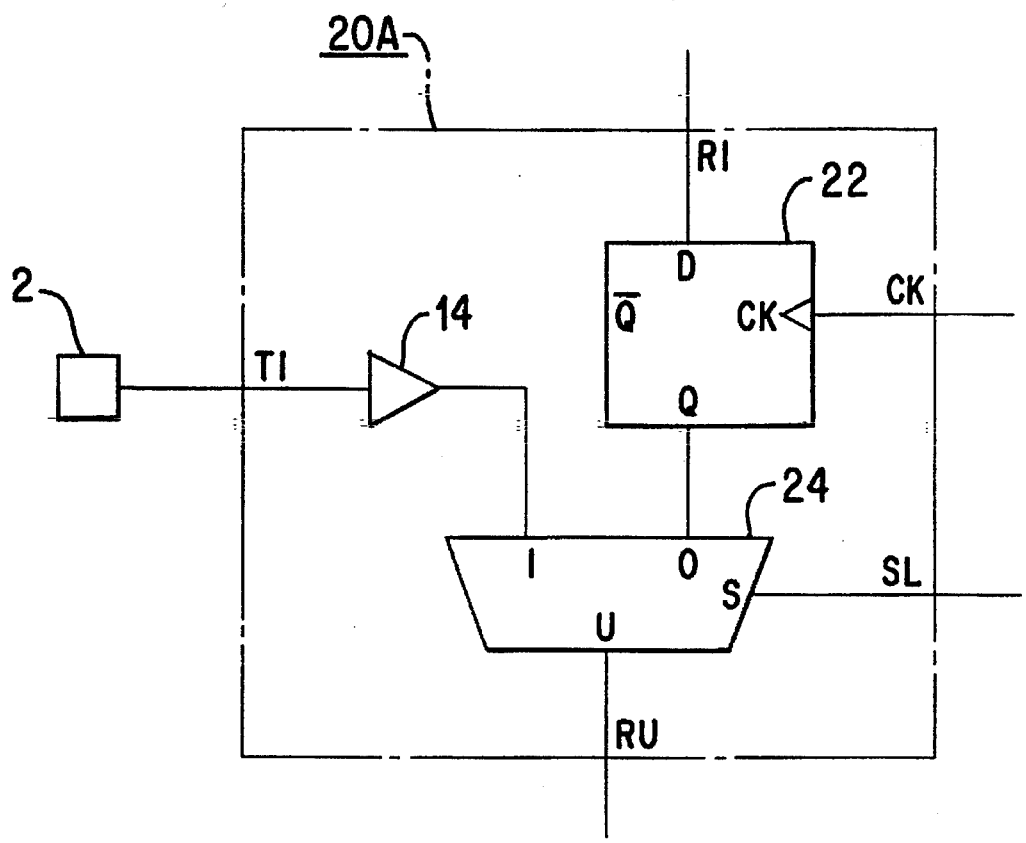
FIG. 6 is a logic circuit diagram of a data recording component.

In FIG. 6, the data recording components 20A is shown in greater detail. A D-flip-flop 22 is the data recorder. The multiplexer 24 outputs either the output of the buffer gate 14 or the output of the D-flip-flop 22 based on the select signal SL. As shown in FIG. 2, the data recording components 20A are serially connected by connecting the inputs RI at one data recording component 20A to the outputs RU of another data recording component 20A. Thus, all the data recording components 20A form a recording shift register. In addition, the output TU of the bonding pad logic state component 10 and the input TI of a corresponding data recording component 20A are both connected to one of the corresponding bonding pads 2.

The clock inputs of all the bonding pad logic state components 10 and the data recording components 20A are connected to a test pad 4A. Thus, upon a clock signal CK, the logic state shift register formed by the bonding pad logic state components 10 and the recording shift register formed by the data recording components 20A shifts data along the respective shift registers.

As shown in FIG. 5, the ST input of the D-flip-flop 16b and the D-flip-flop 18b are connected together forming an ST input of the bonding pad logic state component 10. FIG. 2 shows that all the ST inputs of the logic state components 10 are connected together to the test pad 4B. Thus, after data has been shifted into the logic state shift register, a signal applied to the test pad 4B moves the data in D-flip-flops 16a and 18a into the D-flip-flops 16b and 18b, thus applying the data to the tristate buffer gate 12.

In FIG. 2, the SL line of all the data recording components 20A are connected to test pad 4C. Since the SL signal line controls whether the multiplexer 24 outputs the signal from the output of the D-flip-flop 22 or the output of the buffer gate 14, all the data recording component outputs RU will be either the output of the corresponding buffer gate 14 or the output of the corresponding D-flip-flop 22 at the same time. Thus, to readout the data of all the bonding pads 2, the SL signal is first set to select the output of the buffer gate 14 so that the data of the bonding pad 2 will be recorded in the D-flip-flop 22 of a data recording component 20A. Then, the SL signal is set to select the output of the D-flip-flop 22 to shift out the data captured by the previous process.

The SI input of the logic state shift register connected to an output SU of a data control circuit 30. The output RU of the recording shift register is connected to an input RI of the data control circuit 30. The SL output of the data control circuit 30 is connected to test pad 4C. An input/output signal DT of the data control circuit 30 is connected to a test pad 4D.

The data shifted out of the recording shift register is shifted to the external component through the test pad 4C. The external component shifts data into the logic state shift register through the test pad 4D. The selection of whether to shift data into the external component or out of the external component is determined by the SL signal input also connected to test pad 4C.

Figure 3:
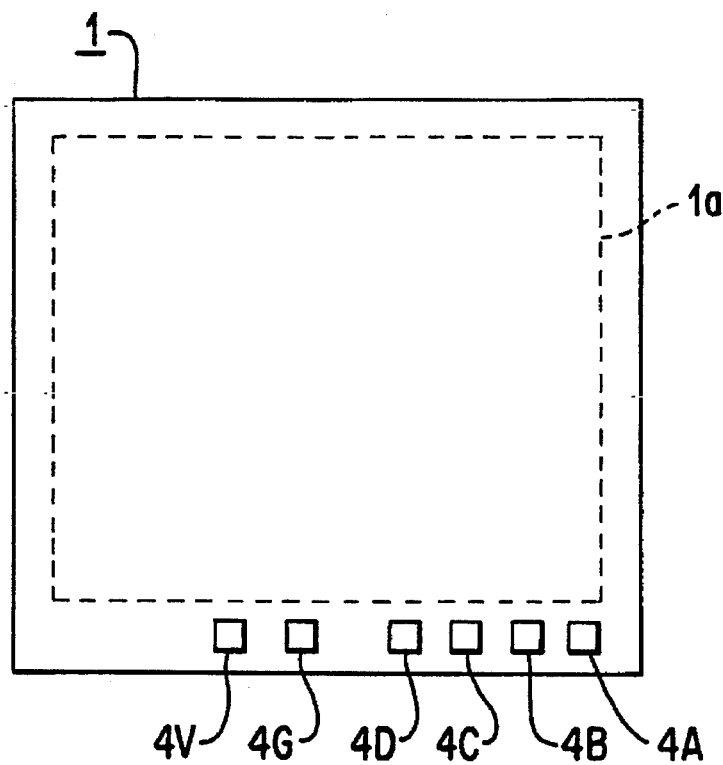
FIG. 3 is a plane surface diagram of an integrated circuit chip.

FIG. 3 shows the bonding pads 2 distributed within the test circuit 1b. The internal logic circuit 1c is formed within a internal control region 1a. The integrated circuit chip 1 includes test pads 4A–4D, 4G and 4V. The test pads 4A–4D, 4G and 4V are larger than the bonding pads 2 which are formed within the internal circuit region 1a. Thus gaps between the test pads 4A–4D, 4G and 4V are greater than the positional gaps between the bonding pads 2.

Figure 4:
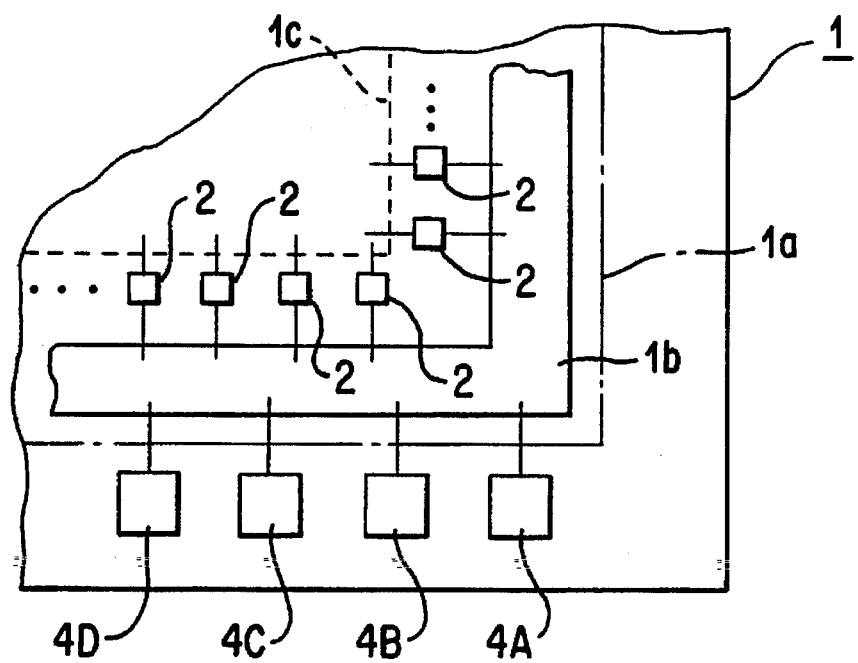
FIG. 4 is a detailed diagram of the lower right portion of FIG. 3.

FIG. 4 is a diagram of the lower right portion of FIG. 3. The test circuit 1b is formed in the outermost portion of the internal circuit region 1a. The bonding pads 2 are formed between the test circuit 1b and the internal logic circuit 1c.

The bonding pads 2 are connected to specified distribution lines within the internal logic circuit 1c. The internal logic circuit 1c is connected to the external component by wire bonding to the bonding pads 2. The bonding pads are also connected to the test circuit 1b and to the test pads 4A–4D, 4G and 4V.

For the embodiments shown in FIG. 4, the logic circuits of the integrated circuit chip 1 is formed within the internal logic circuit 1c. The scribe line which is removed by dicing is outside the area where the bonding pads 2 are formed.

In FIG. 5, the bonding pad logic state component 10 is shown to comprise D-flip-flops 16a, 16b, 18a and 18b. The D-flip-flops 16a and 16b are edge trigger type D-flip-flops and the D-flip-flops 16b and 18b are the strobe type D-flip-flops. The tristate data recorder comprises the D-flip-flops 16a and 18a and the tristate control recorder comprises the D-flip-flops 16b and 18b. The D-flip-flops 16a and 16b are connected into a serial shift register of the bonding pad logic state component 10 having input signal SI and output signal SU. The bonding pad logic state components 10 corresponding to all the bonding pads 2 are serially connected together to form the logic state shift register having an input SI.

Data is shifted into the logic state shift register through the input SI. The data of the D-flip-flop 16a is set into the D-flip-flop 16b for output through the tristate buffer gate 12. The data of the D-flip-flop 18a is set into the D-flip-flop 18b to control the tristate buffer gate 12. The data of the D-flip-flop 18b sets the tristate buffer gate output TU to either a high impedance state or the data contained in the D-flip-flop 16b. Thus, the tristate buffer gate output TU is unaffected when data is shifted in the logic state shift register D-flip-flops 16a and 16b. Thus, the logic state shift register may be shifted during operation of the integrated circuit. After data is serially shifted into the D-flip-flop 16a and 18a, the D-flip-flops 16b and 18b records the data in the D-flip-flop 16a and 18a, respectively, upon an input signal ST.

FIG. 6 shows the data recording component 20a in greater detail. The data recording component 20A comprises the D-flip-flop 22, a multiplexer 24, and a buffer gate 14. The D-flip-flop 22 is used as the data recorder.

The output of the D-flip-flop 22 is connected to one of the data inputs of the multiplexer 24. The other one of the multiplexer inputs is connected to the output of the buffer gate 14. The S input of the multiplexer is connected to the input control line SL. When the input signal SL is in the H state, the output of the buffer gate 14 is passed through the multiplexer to the output U which is also the output of the data recording component 20A. While the input signal SL is in the H state and a clock signal CK is input to the clock input of the D-flip-flop 22, the output of the buffer gate 14 of the data recording component 20A connected to the RI input of the D-flip-flop 22 is recorded in the D-flip-flop 22. Then, the input SL is set to the L state by setting the test pad 4C to the L state and another clock signal CK is input to test pad 4A, the data recorded in the D-flip-flop 22 is serially shifted. Thus, by setting the input SL to the L state and inputting successive clock signals CK to test pad 4A, the recorded data in the D-flip-flops 22 is serially shifted to the test pad 4D through the data control circuit 30.

Figure 7:
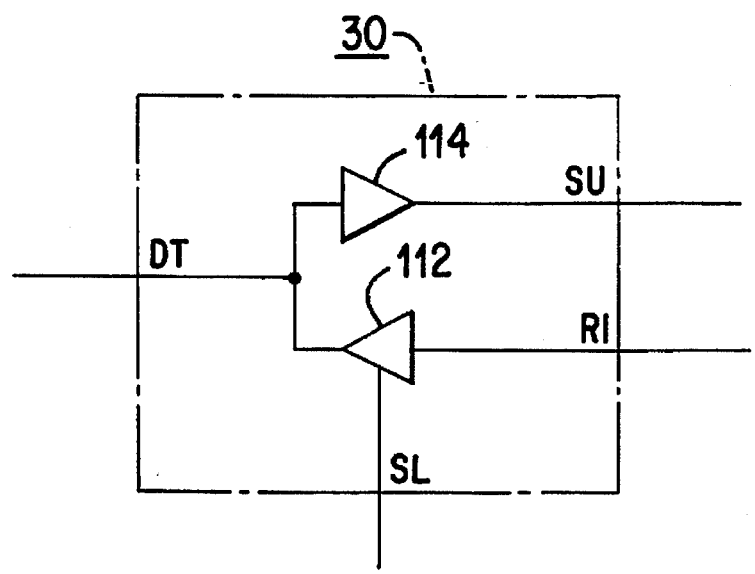
FIG. 7 is a logic circuit diagram of a data control circuit.
Figure 9A:
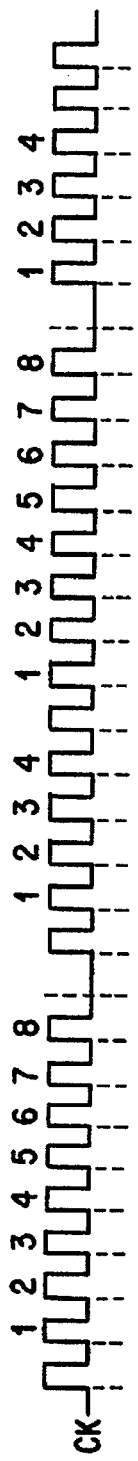
FIG. 9A–9D is a timing diagram of the operational example of FIG. 8.
Figure 9B:
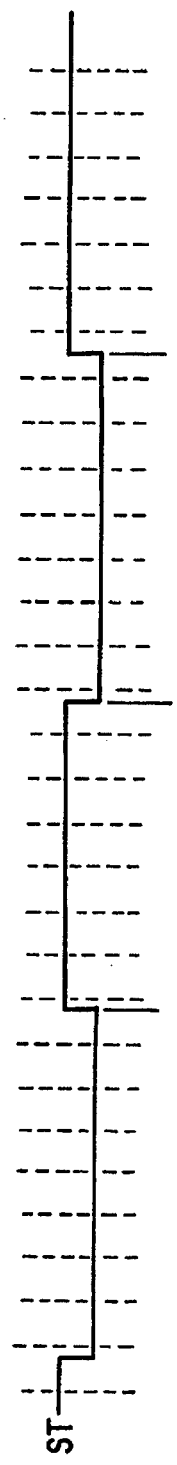
Figure 9C:
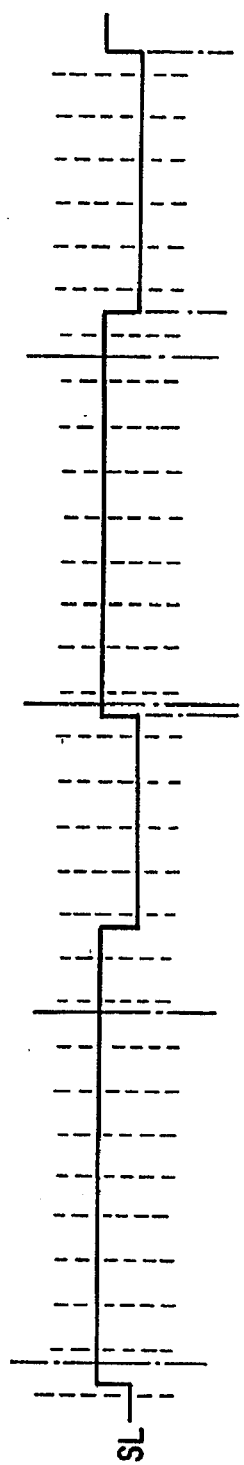
Figure 9D:
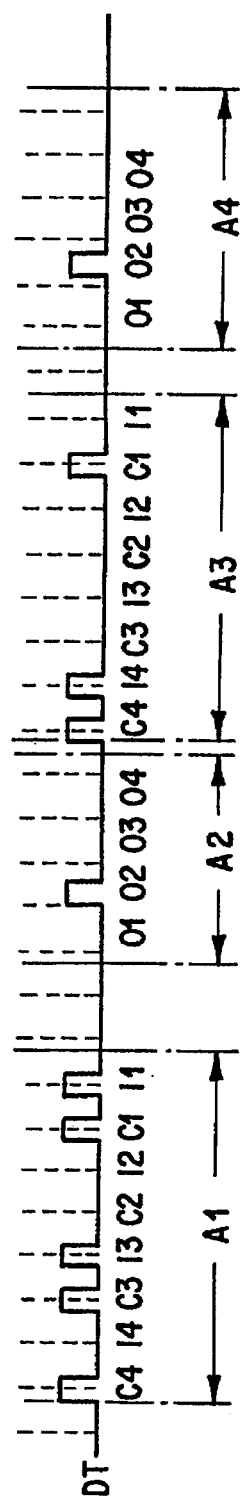

FIG. 7 shows the logic circuit of the control circuit 30. The output of the tristate output buffer gate 112 and the input of the buffer gate 114 are connected to the input/output signal DT of the data control circuit 30. The input/output signal DT is connected to the test pad 4D. The input of the tristate output buffer gate 112 is connected to the input of the RI of the data control circuit 30. A control input of the tristate buffer gate 112 is connected to the input SL of the data control circuit 30. The output of the buffer gate 114 is connected to the output SU of the data control circuit 30.

The data of the input/output signal DT connected to the test pad 4D passes through the buffer gate 114, and is output to the input SI of the logic state shift register as shown in the lowermost part of FIG. 2. By setting the test pad 4c to the H state, the input SL of the data control circuit 30 is set to the H state and the data of the recording shift register, shown in the lowermost part of FIG. 2, is output through the output RU to the test pad 4D, passing through the tristate output buffer gate 112.

The following is a description of a specific embodiment of the invention. Reference is made to 4 bonding pads P1, P2, P3 and P4 which are connected to the test circuit 1b shown in FIG. 2. The number of the corresponding test circuits 6 is limited to 4.

Figure 8:
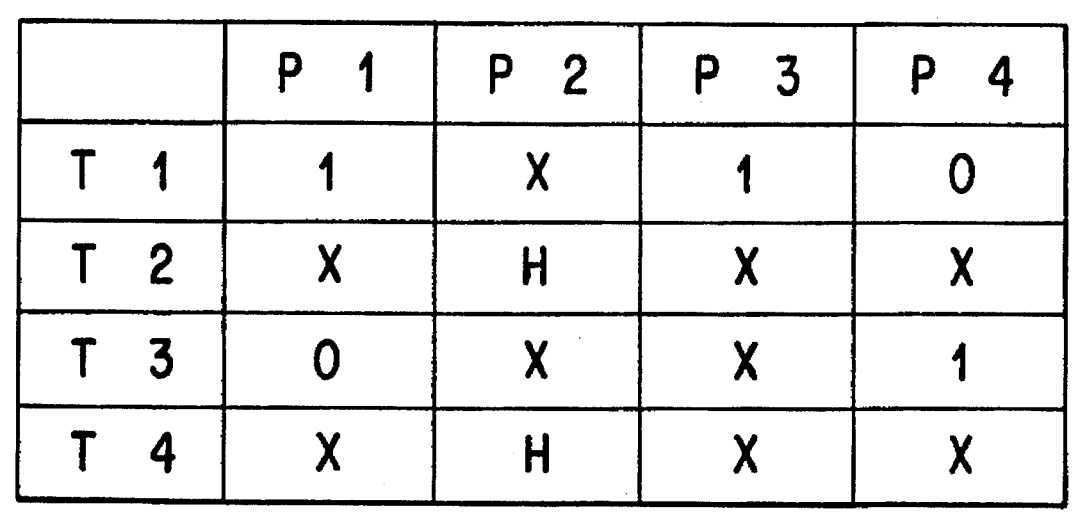

FIG. 8 shows the input pattern T1 input to the internal logic circuit 1c. The internal logic circuit 1c outputs pattern T2 in response to the input pattern T1. Input pattern T3 is input to the internal logic circuit 1c and the internal logic circuit 1c outputs the output pattern T4 is of responding to the input pattern T3.

In FIG. 8, for the input pattern T1 and T3, "1" is the H state, "0" is the L state, and "X" is the high impedance state. The high impedance state does not input either the "H" state or the "L" state. In the output pattern T2 and T4, from the internal logic circuit 1c, "H" is the H state, "L" is the L state and "X" is the high impedance state.

The input pattern T1 inputs the H state to the bonding pads P1 and P3, the L state to the bonding pad P4 and the high impedance state to the bonding pad P2. Responding to the input pattern T1, the internal logic circuit 1c outputs the pattern T2. The high impedance state is output through the bonding pads P1, P3, and P4. The H state is output through the bonding pad P2.

The pattern T3 inputs the L state from the bonding pad P1, the H state from the bonding pad P4, and the high impedance state from the bonding pads P2 and P3. Responding to the input pattern T3, the internal logic circuit 1c outputs the pattern T4. The high impedance state is output through the bonding pads P1, P3, and P4 and the H state is output to the bonding pad P2.

FIGS. 9A–9D is a timing diagram of signals CK, ST, SL and DT for patterns T1–T4, respectively. In the period A1, the input pattern T1 is input; in the period A2, the output pattern T2 is readout and confirmed; in the period A3, the input pattern T3 is input; and in the period A4, the output pattern T4 is readout and confirmed.

The clock signal CK is input from the test pad 4A. Pulse numbers are shown above the clock signal CK during the respective time periods A1–A4. The signal ST is input from the test pad 4B, the signal SL is input from the test pad 4C, and the signal DT is input/output from the test pad 4D.

For the signal DT, C1–C4 indicate the data of the D-flip-flop 18a of the bonding pad logic state component 10 corresponding to the bonding pads P1–P4. This data is the data finally set in the D-flip-flop 18b. I1–I4 indicate the data of the D-flip-flop 16a of the bonding pad logic state component 10 corresponding with the bonding pads P1–P4. This data is the data finally set in the D-flip-flop 16b. The numbers 01–04 indicate the data finally set in the D-flip-flops 22 of the data recording components 20A, corresponding to the bonding pads P1–P4.

In the period A1 the first (1) clock signal CK inputs the H state corresponding to the bonding pad P4 to be finally set into the D-flip-flops 18a and 18b. The second (2) clock signal CK inputs the L state I4 corresponding to the bonding pad P4 to be finally set into the D-flip-flops 16a and 16b. The third (3) clock signal CK inputs the H state corresponding to the bonding pad P3 to be finally set into the D-flip-flops 18a and 18b. The fourth (4) clock signal CK inputs the H state I4 corresponding to the bonding pad 3 finally set into the D-flip-flops 16a and 16b and so forth, through the fifth (5) to eighth (8) clock signals CK. The same process occurs for the period A3.

Figure 10:
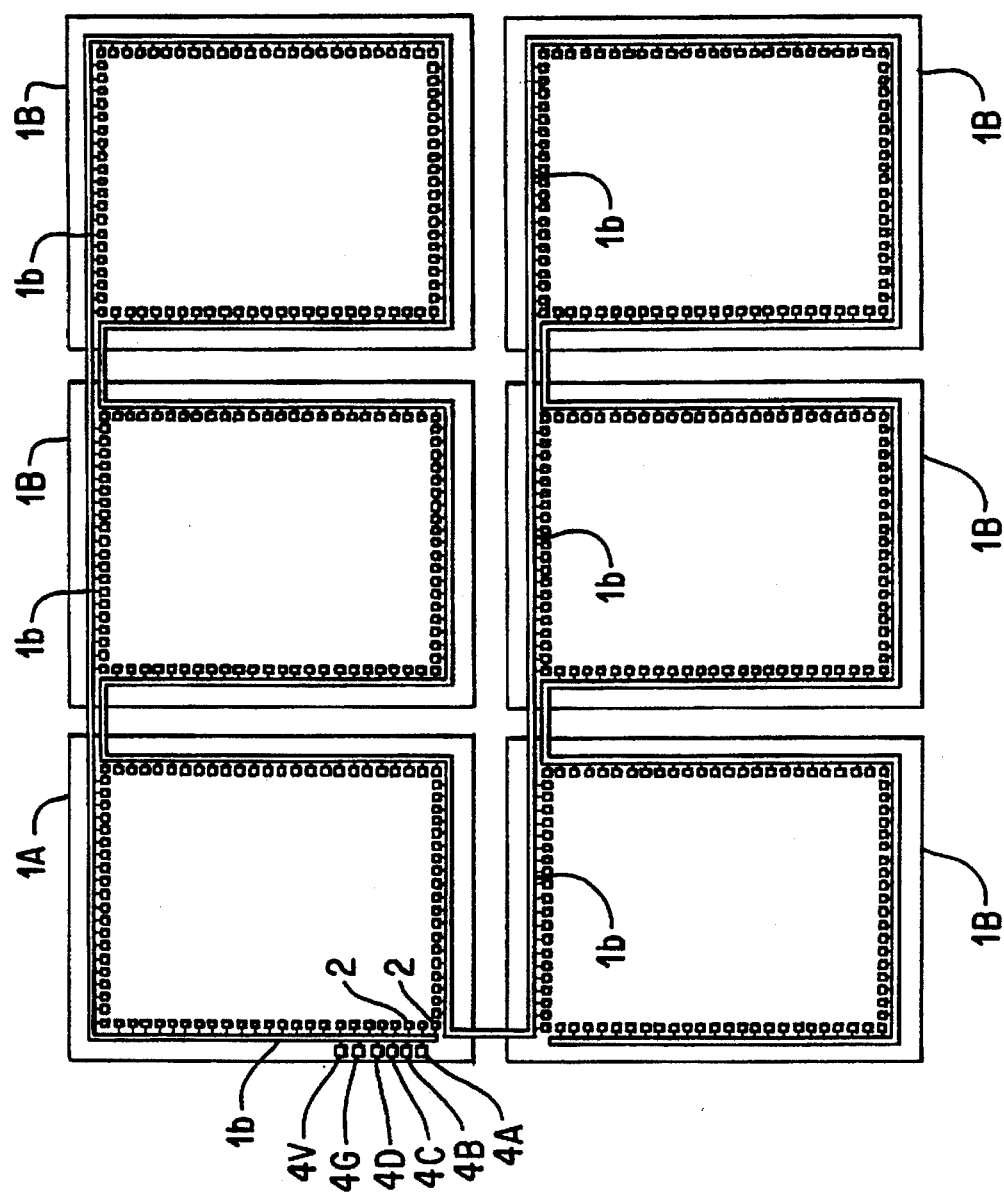
FIG. 10 is a plane surface diagram showing a semiconductor wafer.

FIG. 10 is a plane surface diagram of a semiconductor wafer of a second embodiment. One integrated circuit 1A and five integrated circuits 1B are formed on a single semiconductor wafer. The integrated circuits 1A and 1B may be of the type shown in FIGS. 3 and 4. The test pads 4A, 4D, 4G, and 4V are attached as shown in FIG. 3. The test pads 4A, 4D, 4G, and 4V are provided on the integrated circuit chip 1A. A test circuit 1b is formed for integrated circuit 1A and for each of the five integrated circuits 1B. The test circuit 1b includes the D-flip-flops 16a and 18a of the bonding pad logic state components 10 connected as the logic state shift register. The D-flip-flops 22; the data recorders of the data recording 20A, are connected as the recording shift register.

The logic state and recording shift registers formed by the bonding pad logic state components 10 and data recording components 20A, respectively, are formed entirely within the integrated circuit chip 1A and the five integrated circuit chips 1B. Thus, data is shifted into the bonding pad components 10 and shifted out of the data recording components 20A for all the integrated circuits 1A and 1B of the semiconductor wafer at the same time in one serial shift operation.

Forming only one set of test pads 4A–4D, 4G, and 4V provides several advantages. The test pads 4A–4D, 4G, and 4V may be formed on an area of the semiconductor wafer not used for integrated circuits 1A and 1B. Since there is only one set of test pads 4A–4B, 4G and 4V, the probe card needs to be positioned only once for testing all six integrated circuits 1A and 1B. Thus, operational testing efficiency is improved.

Although the lengths of the logic state and recording shift registers are several times longer than if test pads 4A–4D, 4G and 4V are formed for each integrated circuit 4A and 4B, test time is still measurably shortened because the probe card is positioned only once. Positioning the probe card generally takes more time than the time required for serial shift operations to shift data into and out of the longer shift registers.

The test pads 4A–4D, 4G and 4V may be formed exterior to the integrated circuit chips 1A or 1B. In FIG. 10, the test pads 4A–4D, 4G and 4V are formed outside the region of the integrated circuit chip 1A. Thus, reduction in the size of the integrated circuit chip 1A is achieved which further reduce the size of the integrated circuit chip 1A.

Figure 11:
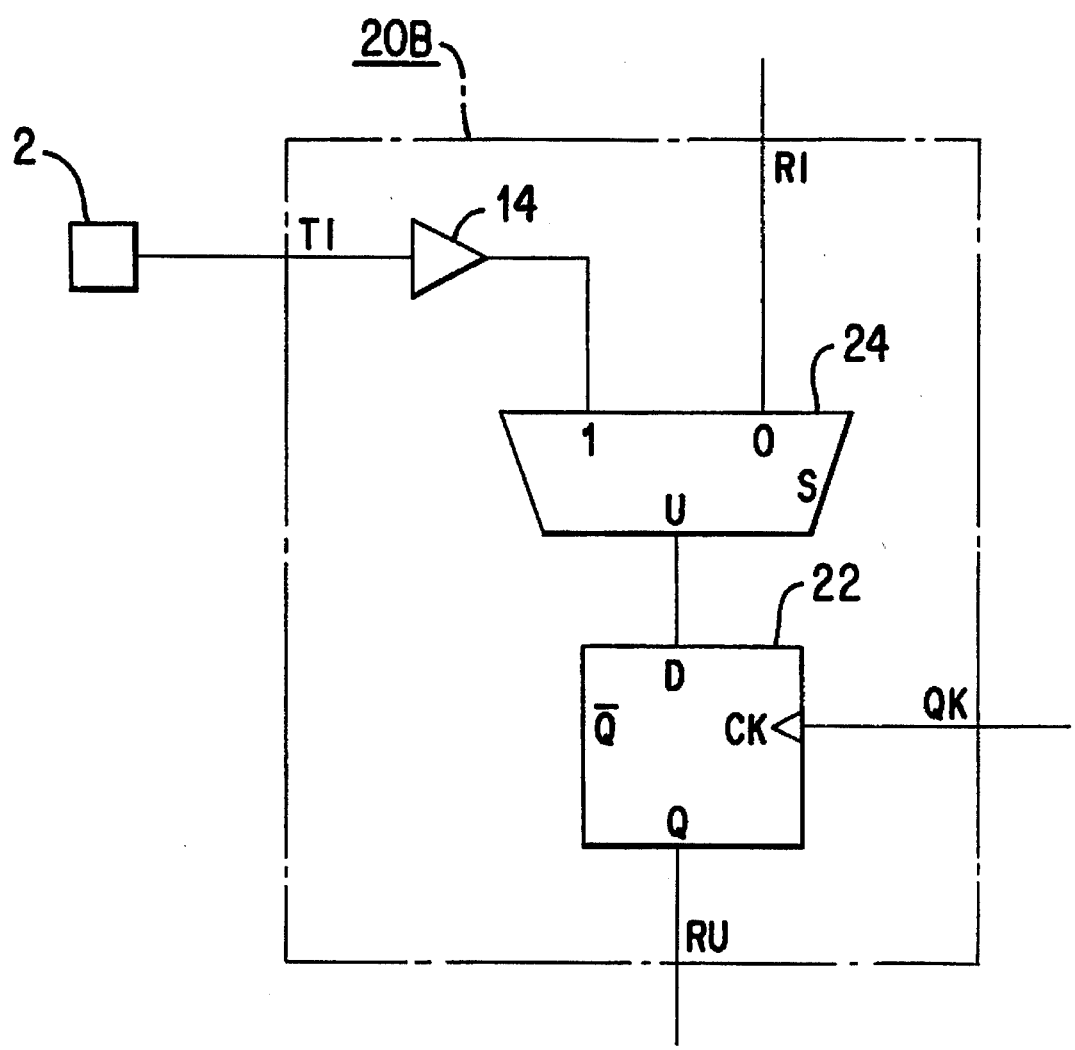
FIG. 11 is a logic circuit diagram of another data recording component.

FIG. 11 is another embodiment for the data recording component 20A of FIG. 6. The data recording component 20B, includes a D-flip-flop 22, which is used as a data recorder, a 2 input multiplexer 24, and a buffer gate 14.

Figure 12:
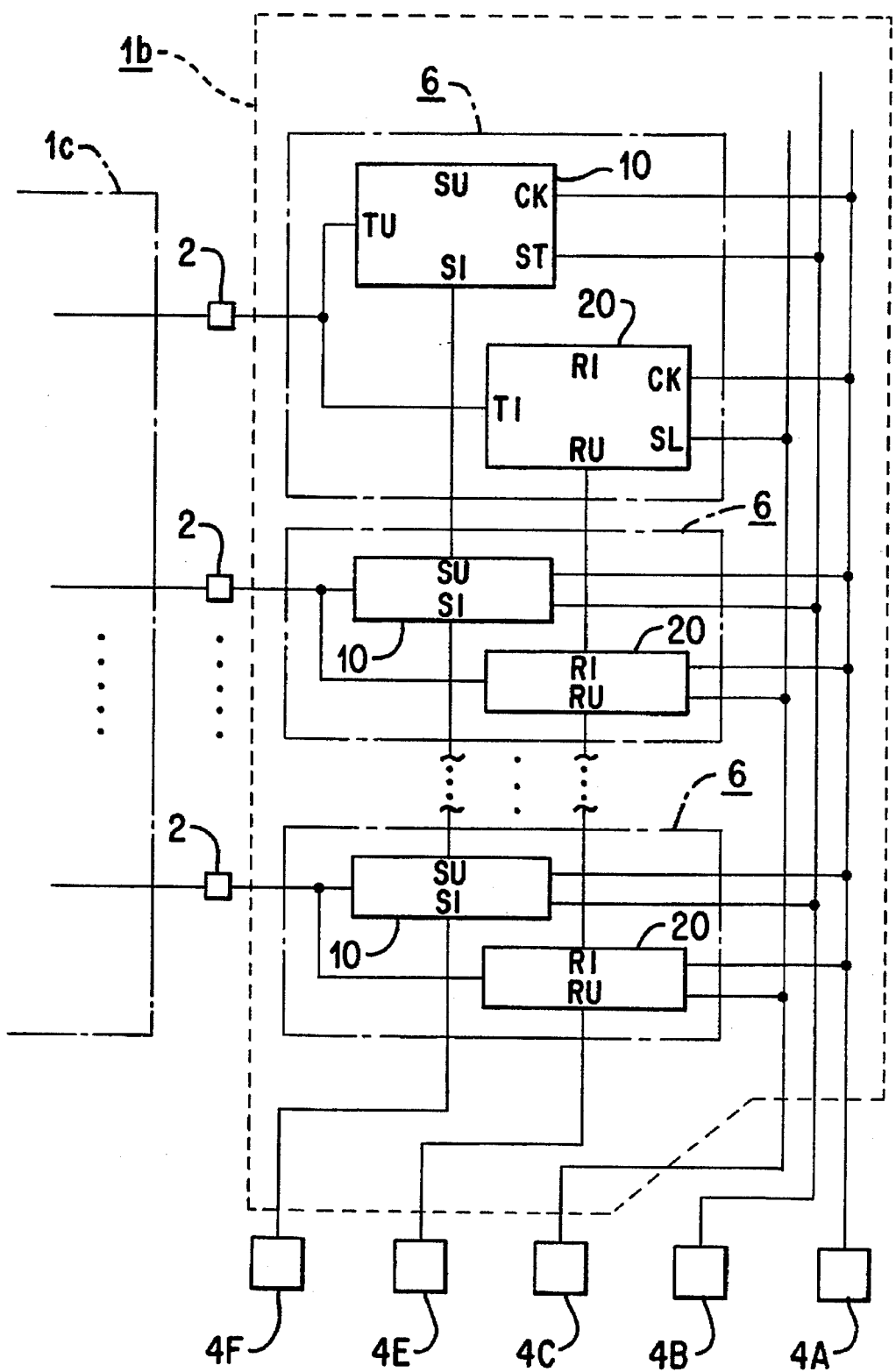
FIG. 12 is a logic circuit diagram of the test circuit incorporating the data recording component of FIG. 11.

FIG. 12 is a circuit diagram of a test circuit 1b. This embodiment functions similarly as the embodiment shown in FIG. 2, only the circuits near the data control circuit 30 functions differently. In FIG. 2, the input of the bonding pad logic state components 10 of the test circuit 6 and the output RU of the data recording component 20A are respectively connected to the output SU of the data control circuit 30 or to the input of the RL. In FIG. 12, the input of the bonding pad logic state components 10 of the test circuit 6 is connected to the test pad 4F, and the output RU of the data recording component 20 is connected to the test pad 4E. Thus, the setting of the data from the external component and the readout of the data can be simultaneously performed because the test pads 4F and 4E are used independently.

While this invention has been described in conjunction with specific embodiments thereof, it is evident that many alternatives, modification and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A probe testing device that tests at least one integrated circuit formed on a semiconductor wafer, the probe testing device comprising:

a plurality of bonding pads formed on the semiconductor wafer exterior to the integrated circuit and coupled to the integrated circuit;

logic circuits formed on the semiconductor wafer exterior to the integrated circuit and coupled to the plurality of bonding pads, the logic circuits setting each of the plurality of bonding pads to a bonding pad state;

a plurality of test pads exterior to the integrated circuit coupled to the logic circuits; and an external device coupled to the plurality of bonding pads through the logic circuits, the external device controlling the logic circuits to set the bonding pad state of each of the plurality of bonding pads and to input data from and output data to the plurality of bonding pads independent of an operation of the integrated circuit.

2. The probe testing device of claim 1, wherein the logic circuits comprise:

a plurality of bonding pad logic state circuits, each of the plurality of bonding pad logic state circuits corresponding to one of the plurality of bonding pads, the plurality of bonding pad logic state circuits setting the bonding state of each of the plurality of bonding pads based on control signals received from the external device; and a plurality of data recording circuits, each of the plurality of data recording circuits corresponding to one of the plurality of bonding pads, the plurality of data recording circuits recording bonding pad data from the plurality of bonding pads and outputting the bonding pad data to the external device based on the control signals received from the external device.

3. The probe testing device of claim 2, wherein each of the plurality of bonding pad logic state circuits comprises:

a tristate buffer gate, an output of the tristate buffer gate being connected to a corresponding bonding pad;

a tristate control recorder having a control output, the control output being connected to a control input of the tristate buffer gate; and a tristate data recorder having a data output, the data output being connected to a data input of the tristate buffer gate, wherein the control output of the tristate control recorder sets the bonding pad state of the corresponding bonding pad to one of a high impedance state and a data state by setting the tristate buffer gate to one of a high impedance mode and a pass through mode, respectively, the pass through mode setting the bonding pad to a data value equal to a data value of the data output of the tristate data recorder.

4. The probe testing device of claim 3, wherein the tristate control and data recorders of each of the plurality of bonding pad logic state circuits are serially connected to form a plurality of bonding pad logic state shift registers, the plurality of bonding pad logic state shift registers being serially connected to form a logic state shift register, the logic state shift register being coupled to the external device by connecting to the plurality of test pads, the external device sending the control signals to the tristate control and data recorders of each of the plurality of bonding pad logic state circuits by serially shifting the control signals through the logic state shift register.

5. The probe testing device of claim 3, wherein the tristate control recorder comprises:

a receiving element; and a setting element, wherein the receiving element receives the control signals from the external device and the setting element records a data value of the receiving element when the external device activates a strobe signal, the receiving element outputting the recorded data value to the control input of the tristate buffer gate through the control output of the tristate control recorder.

6. The probe testing device of claim 3, wherein the tristate data recorder comprises:

a receiving element; and a setting element, wherein the receiving element receives the control signals from the external device and the setting element records a data value of the receiving element when the external device activates a strobe signal, the receiving element outputting the recorded data value to the data input of the tristate buffer gate through the data output of the tristate data recorder.

7. The probe testing device of claim 2, wherein each of the plurality of data recording circuits comprises:

a buffer gate, an input of the buffer gate being connected to a corresponding bonding pad;

a recording element; and a multiplexer having two inputs, one of the two inputs being connected to an output of the buffer gate and the other of the two inputs being connected to the output of the recording element, the recording element recording data from the corresponding bonding pad based on the control signal from the external device.

8. The probe testing device of claim 3, wherein an input of the recording element and an output of the multiplexer are an input and output, respectively, of each of the plurality of data recording circuits, the input and output of each of the plurality of data recording circuits being serially connected to form a recording shift register, the recording shift register being coupled to the external device by connecting to the plurality of test pads, the external device receiving recorded data from each of the plurality of data recording circuits by serially shifting the recorded data through the recording shift register.

9. A probe testing device that tests at least one integrated circuit formed on a semiconductor wafer, the probe testing device comprising:

a plurality of bonding pads formed on the semiconductor wafer exterior to the integrated circuit and coupled to the integrated circuit;

a plurality of test pads formed on the semiconductor wafer exterior to the integrated circuit;

an external device coupled to the plurality of bonding pads and to the plurality of test pads, the external device determining a bonding pad state of each of the plurality of bonding pads, the external device inputting data from and outputting data to the plurality of bonding pads independent of an operation of the integrated circuit;

a plurality of bonding pad logic state circuits exterior to the integrated circuit, each of the plurality of bonding pad logic state circuits corresponding to one of the plurality of bonding pads, the plurality of bonding pad logic state circuits setting the bonding pad state of each of the plurality of bonding pads based on control signals received from the external device, wherein each of the plurality of bonding pad logic state circuits comprises:

a tristate buffer gate, an output of the tristate buffer gate being connected to a corresponding bonding pad;

a tristate control recorder having a control output, the control output being connected to a control input of the tristate buffer gate; and a tristate data recorder having a data output, the data output being connected to a data input of the tristate buffer gate, wherein the control output of the tristate control recorder sets the bonding pad state of the corresponding bonding pad to one of a high impedance state and a data state by setting the tristate buffer gate to one of a high impedance mode and a pass through mode, respectively, the pass through mode setting the bonding pad to a data value equal to a data value of the data output of the tristate data recorder, and wherein the plurality of bonding pad logic state circuits are serially connected to form a logic state shift register, the logic state shift register being coupled to the external device by connecting to the plurality of test pads, the external device sending the control signals to the plurality of bonding pad logic state circuits by serially shifting the control signals through the logic state shift register.

10. The probe testing device of claim 9, wherein at least one of the tristate control recorder and the tristate data recorder of each of the plurality of bonding pad logic state circuits form the logic state shift register.

11. The probe testing device of claim 10, wherein scribe lines are formed on the semiconductor wafer, the plurality of bonding pad logic state circuits and the plurality of test pads are formed on the scribe lines, the scribe lines being external to the at least one integrated circuit and being removed during a dicing process.

12. The probe testing device of claim 11, wherein at least a portion of the plurality of test pads are formed on an external circumference of the semiconductor wafer.

13. The probe testing device of claim 9, further comprising:

a plurality of data recording circuits, each of the plurality of data recording circuits corresponding to one of the plurality of bonding pads, the plurality of data recording circuits recording bonding pad data from the plurality of bonding pads and outputting the bonding pad data to the external device based on the control signals received from the external device, wherein each of the plurality of data recording circuits comprises:

a buffer gate, an input of the buffer gate being connected to a corresponding bonding pad;

a recording element; and a multiplexer having two inputs, one of the two inputs being connected to an output of the buffer gate and the other of the two inputs being connected to the output of the recording element, the recording element recording data from the corresponding bonding pad based on the control signal from the external device, and wherein an input of the recording element and an output of the multiplexer are an input and output, respectively, of each of the plurality of data recording circuits, the input and output of each of the plurality of data recording circuits being serially connected to form a recording shift register, the recording shift register being coupled to the external device by connecting to the plurality of test pads, the external device receiving recorded data from each of the plurality of data recording circuits by serially shifting the recorded data through the recording shift register.

14. The probe testing device of claim 13, wherein at least one of the tristate control recorder and the tristate data recorder of each of the plurality of bonding pad logic state circuits form the logic state shift register.

15. The probe testing device of claim 14, wherein scribe lines are formed on the semiconductor wafer, the plurality of bonding pad logic state circuits and the plurality of test pads are formed on the scribe lines, the scribe lines being external to the at least one integrated circuit and being removed during a dicing process.

16. The probe testing device of claim 15, wherein at least a portion of the plurality of test pads are formed on an external circumference of the semiconductor wafer.

17. A method for probe testing at least one integrated circuit formed on a semiconductor wafer, comprising:

providing a plurality of test pads and plurality of bonding pads formed on the semiconductor wafer exterior to the integrated circuit, the plurality of bonding pads being coupled to the integrated circuit;

setting each of the plurality of bonding pads to a bonding pad logic state through logic circuits which are coupled to the plurality of bonding pads and the plurality of test pads;

determining the logic state of each of the plurality of bonding pads by an external device, the external device controlling the logic circuits independent of an operation of the integrated circuit; and inputting an outputting data to and from the plurality of bonding pads through the logic circuits by sending control signals from the external device using the plurality of test pads.

18. The method of claim 17, wherein the logic circuit comprises:

a plurality of bonding pad logic circuits; and a plurality of data recording circuits, wherein the plurality of bonding pad logic circuits are formed into a logic state shift register and the plurality of data recording circuits are formed into a recording shift register.

19. The method of claim 17, wherein inputting and outputting data comprises:

serially shifting the control signals from the external device through the logic state shift register to input data to the plurality of bonding pads and setting the logic state of the plurality of bonding pads; and serially shifting the recording shift register to output data recorded from the plurality of bonding pads to the external device.

* * * * *